United States Patent [19]

Hunter

[11] 3,962,241

[45] June 8, 1976

[54] LIGHT-SENSITIVE POLYMERIC COMPOUNDS

[75] Inventor: Donald Noel Hunter, Great Bookham, England

[73] Assignee: U.S. Philips Corporation, New York, N.Y.

[22] Filed: July 22, 1974

[21] Appl. No.: 490,724

[30] Foreign Application Priority Data

July 31, 1973 United Kingdom............... 36289/73

[52] U.S. Cl................................ 260/249.5; 260/61; 96/115 R; 427/53
[51] Int. Cl.$^2$....................................... C07D 251/46
[58] Field of Search.............. 260/248 CS, 249.5, 61

[56] References Cited

UNITED STATES PATENTS

| 3,255,191 | 6/1966 | Dexter et al. | 260/248 |
| 3,847,915 | 11/1974 | Bishop et al. | 260/249.5 |

*Primary Examiner*—John M. Ford
*Attorney, Agent, or Firm*—Frank R. Trifari; Norman N. Spain

[57] ABSTRACT

Light sensitive cyanuric azide polycondensates which are capable of becoming insoluble in selected solvents upon exposure to light and which are useful in the preparation of photo-mechanical resist compositions.

6 Claims, 1 Drawing Figure

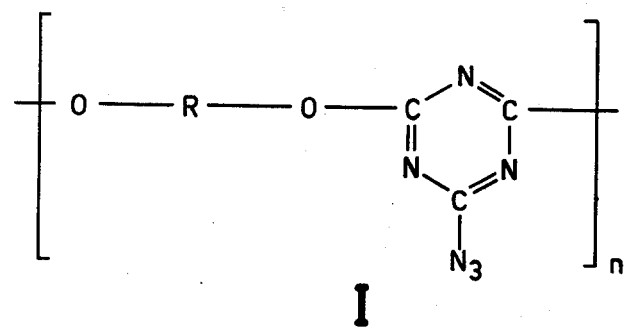
I
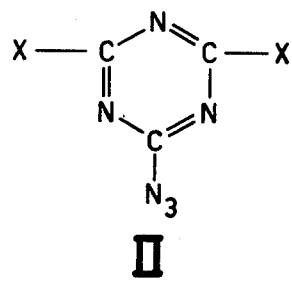
II
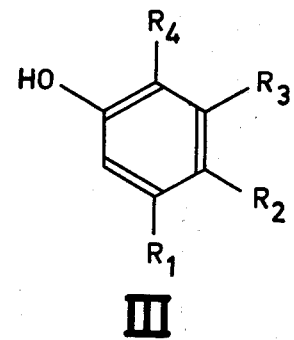
III

LIGHT-SENSITIVE POLYMERIC COMPOUNDS

The present invention relates to light sensitive polymeric compounds, their preparation, and to light-sensitive compositions containing the same.

In particular, this invention relates to light-sensitive cyanuric azide polycondensates.

In the ensuing description, reference is made to the accompanying drawings, wherein are set out certain structural chemical formulae, serially numbered for identification and further described below.

It is known that polymeric compounds have been used in photo-mechanical printing processes as light-sensitive agents. Thus, light-sensitive polymeric compounds have been used to produce positive or negative photographic relief images on the surface of substrates by coating the surface of a substrate with light-sensitive composition containing the compounds, exposing at least one part of the coating to irradiated light, removing either the exposed or the unexposed part of the resist coating and treating the surface of the substrate (for example, by etching or electroplating) to produce an appropriate positive or negative replica of the exposed area on the surface of the substrate.

However, prior to the present invention the production of photo-mechanical resist compositions on the surface of substrates had certain disadvantages, such as a low resolution, poor edge definition of the projected image, pin-hole and other defects in the developed image, such as poor adhesion of the resist coating to the substrate and undue oxidation or instability of the resist coating.

From British Patent Specification Nos. 843,541 and 843,542 it is known that film-forming, light-sensitive synthetic polymers which are capable of becoming insolubilised on exposure to light may be prepared whereby the polymers contain a substantial proportion of side-chains which have —$N_3$ groups attached to carbon aroms therein with not more than two —$N_3$ groups attached to any one side-chain. Such light-sensitive polymers are described and represented as

in which formula U represents the recurring atoms of the polymer chain proper and Z is a linkage joining the azide group. Typical linkages described are given as bivalent radicals of aromatic substances.

The azide group, however, is very reactive and it is particularly difficult to polymerise aromatic azido groups to produce light-sensitive, stable polymeric compounds.

We have discovered that it is possible to prepare stable, novel, light-sensitive polymeric compounds which are suitable for use either alone or in the form of their compositions in photo-mechanical processes by being insolubilised to selected solvents on exposure to light.

According to the present invention there are provided light-sensitive polymeric compounds as represented by the general formula I

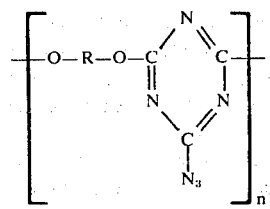

in which formula
n is a whole number from 2 to 120 and
R represents a
phenylene - 1,3,
phenylene - 1,4,
1-phenylcarbonyl-phenylene - 2,4,
1-phenylcarbonyl-phenylene - 2,6,
2,2'-diphenylcarbonyl or
2,3'-diphenylcarbonyl group
or an
1-alkylcarbonyl-phenylene - 2,5,
1 - alkylcarbonyl-phenylene - 2,4 or
1 - alkylcarbonyl-phenylene - 2,6 group
in which the alkyl group contains from 1 to 4 carbon atoms, a
naphthylene - 2,7
naphthylene - 2,6 or
naphthylene - 2,4 - group
wherein the phenyl groups, if desired, are substituted with one or two alkyl groups containing from 1 to 4 carbon atoms or a phenyl group.

The azido group, represented as -$N_3$, formula I above, may alternatively be represented as the resonant structure

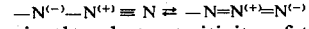

wherein the photosensitivity of the polycondensate is believed to be caused by decomposition of the azido group by energy received from irradiated actinic light to give rise to free valencies which form bonds by further crosslinking with neighbouring polycondensate molecule thereby increasing the insolubility of polycondensate in the exposed region.

In one preferred embodiment, light-sensitive compounds according to the invention are wherein R represents a naphthylene 2,7 group, a 1-benzoyl - phenylene - 2,4 group, a 1-benzoyl - phenylene - 2,6 group, a 1-acetylphenylene - 2,4 or a phenylene - 1,3 group.

In another embodiment, light-sensitive polymeric compounds according to the invention are wherein R represents an 1-alkylcarbonyl-phenylene - 2,6, for example wherein the alkyl group is a methyl group, a 1-alkylcarbonylphenylene 2,5, a 2,3'-diphenyl carbonyl, a 2,2'-diphenyl carbonyl, a phenylene - 1,4 or a naphthylene - 2,6 group.

According to another aspect of the invention there are provided light-sensitive compositions comprising a polymeric compound according to the invention mixed with, dissolved or dispersed in an inert carrier.

The polymeric compounds or light-sensitive compositions prepared therefrom may also be mixed with or contain additives and/or light-sensitive agents.

Preferably, the polymeric compounds are dissolved in a suitable organic solvent with, if desired, an inert diluent. Particularly suitable light-sensitive polymeric compositions are solutions which contain 1,4-dioxane, toluene or cyclohexanone.

Preferably the polycondensation may be exposed to actinic light from any source and of any type. Suitable sources include irradiation from mercury vapour lamps, argon globe lamps, tungsten lamps, carbon arcs and photographic flood-lamps, although a strong light source is not necessarily required to initiate decomposition of the azido group and the subsequent cross-linkage with neighbouring polycondensate molecules. This is especially true for compositions when optical sensitizers, inter alia, are incorporated into the composition. Thus, the light-sensitivity and photo-condensation property of compounds as represented by formula I may be increased; for example by incorporating an optical or light-sensitizer into a composition which contains polycondensates according to the invention, such as Michler's ketone (4,4'-tetramethyldiaminobenzophenone). Other suitable optical or light-sensitizers which may be incorporated into compositions according to the invention are p,p'-tetraethyldiaminodiphenylketone; p,p'-tetramethyldiaminodiphenylketone; p,p'-dimethylaminobenzophenone; 1,2-benzanthraquinone, β-chloroanthraquinone; 9,10-anthraquinone; 4-nitro-chloro aniline; 2,6-dichloro4-nitro-aniline; 2,4,6-trinitroaniline; 5-nitro-2-aminotoluene; and p-nitrodiphenyl.

The light-sensitizers may be incorporated into the polycondensate together with other solid or liquid carrier materials if required, during manufacture of the polymeric compounds according to the invention, or subsequent to their preparation, for example, on the application of the compound or the composition containing the compound to a substrate.

The invention also provides light-sensitive coatings when coated on a substrate with a compound or a composition according to the invention.

In a further aspect the invention provides a method of preparing light-sensitive polymeric compounds of formula 1 comprising condensing, in the presence of a common solvent, a cyanuric azide dihalide as represented by formula II

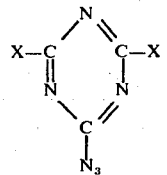

II in which formula X represents a halogen atom with an alkali metal salt of a dihydroxy aromatic compound as represented by formula III

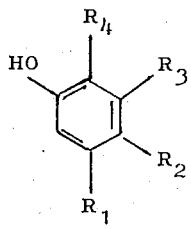

III in which formula $R_1$ represents a hydrogen atom or a hydroxy group, $R_2$ represents a hydrogen atom, a hydroxy group, an alkyl group containing from 1 to 4 carbon atoms or a phenyl group, $R_3$ represents a hydrogen atom, a hdyroxy group, an alkyl group containing from 1 to 4 carbon atoms or a phenyl group, and $R_4$ represents a hydrogen atom, an alkyl group containing from 1 to 4 carbon atoms, a phenyl group, a $R_5CO-$ group in which $R_5$ is an alkyl group containing from 1 to 4 carbon atoms, a phenyl group or a hydroxy phenyl group, with the proviso that only one of $R_1$, $R_2$ and $R_3$ does represent a hydroxy group, and $R_2$ and $R_3$ may together form a tetramethylene group or together with the carbonatoms to which they are bound a benzogroup that is substituted with a hydroxy group.

Suitable dihydroxy aromatic starting materials for preparing compounds according to the invention are 1,3-dihydroxybenzene, 1,4-dihydroxybenzene, 2,4-dihydroxy acetophenone, 2,5-dihydroxy acetophenone, 2,6-dihydroxy acetophenone, 2,4-dihydroxy propiophenone, 2,5-dihydroxy propiophenone, 2,6-dihydroxy propiophenone, 2,4-dihydroxy butyrophenone, 2,5-dihydroxy butyrophenone, 2,6-dihydroxy butyrophenone, 2,4 dihydroxy valerophenone, 2,5-dihydroxy valerophenone, 2,6-dihydroxy valerophenone, 2,4-dihydroxy benzophenone, 2,5-dihydroxybenzophenone, 2,6-dihyroxybenzophenone, 2,2'-dihydroxybenzophenone, 2,3'-dihydroxybenzophenone, and 2,4'-dihydroxy benzophenone.

Preferably cyanuric azide dichloride is condensed with the sodium salt of 2,7-dihydroxy naphthalene, 2,4-dihydroxy benzophenone, 2,6-dihydroxy benzophenone, 2,4-dihydroxy acetophenone or 1,3-dihydroxybenzene.

In the method 1 mole of cyanuric azide dichloride may be condensed with 1 mole of the sodium salt.

The condensation reaction between the alkali metal salt of a dihydric aromatic compound and cyanuric azide dihalides may be carried out in any convenient solvent, providing at least one of the starting materials and the polycondensate so formed are soluble in the solvent selected. In one embodiment, the dialkali metal salt of 2,7-dihydroxy naphthalene is condensed with cyanuric azide dihalide dissolved in a water-miscible organic solvent. A suitable water-miscible solvent may be selected from the group consisting of aldehydes, ketones and alcohols, particularly when the alkyl group contained therein has from 1 to 3 carbon atoms.

Preferably, one mole equivalent of a dialkali metal salt of the dihydroxy aromatic compound is condensed with one mole equivalent of the dihalo cyanuric azide. Polycondensates according to the invention have a wide range of light-sensitivity, good film-forming properties, transparency and flexibility and possess good adhesive characteristics. The polycondensates prior to exposure to actinic light are particularly soluble in solvents such as toluene, xylene, and cyclohexanone, and after exposure to actinic light are insoluble in these solvents. Furthermore, the insolubilized polymer is resistant to acids and alkalis used in etching and electroplating processes.

The present invention also provides a process suitable for use in photomechanical reproduction printing processes, comprising exposing a light-sensitive polycondensate according to formula I as described above to actinic light through a photographic mask, said polycondensate being in the form of a self-supporting film of the compound according to formula I or as a coating on a substrate, said exposure continuing until the azido group of the polycondensate in the exposed regions is decomposed, followed by selectively removing the polycondensate from the unexposed regions by treating with a solvent. The polycondensate is preferably applied to the surface of the substrate in the form of a solution by being dissolved in an organic solvent such as toluene, xylene or cyclohexanone, and after exposure to light the polycondensate in the non-exposed regions is preferably removed by the same solvent.

The polycondensates according to the invention may have a heterogeneous composition in that the may be formed of structural units of different molecular weight compounds, the particular type and molecular weight range of the recurring structural unit being determined by the choice of the starting materials and the amount of cross-linkage after exposure to light.

The cyanuric azide dihalide selected is preferably cyanuric azide dichloride, as represented by formula II, which may be prepared in accordance with the method described by C. V. Hart, J. Am. Chem. Soc., 50, 1922 (1928).

Substrates suitable for the coating with polycondensates according to the invention may be selected from natural or synthetic solid materials and/or composites of the same, providing the surface is suitable to support the polycondensate. Particularly suitable substrates are laminar materials such as metal sheets, for example copper, aluminium, magnesium and zinc sheets or plates, composite laminated sheet materials, for example copper-clad/phenol formaldehyde laminates, and plastics foil materials such as polyvinyl acetal, cellulose esters, polyethylene terephthalate and polystyrene foils. Other suitable substrates are semiconductor materials, such as silicon, germanium, or germanium silicon alloys and metallic oxide semiconductors such as copper oxide. Solutions of the polycondensates according to the invention may be coated onto the surface of a substrate and allowed to dry.

The desired thickness of a coating on the substrate is chosen in accordance with the type and molecular weight of the recurring structural unit(s) in the polycondensate and also in accordance with the intensity of the irradiated light, the exposure time and the degree of cross-linkage for the insolubilised regions of the polymeric coating.

By way of illustration, certain preferred processes embodying the invention will now be described in more detail in the ensuing specific Examples:

EXAMPLE 1

Cyanuric chloride, 36.8 grams (1/5 mol), was dissolved in 200 ml acetone agitated in a 400 ml beaker. Sodium azide, 13 grams (1/5 mol), dissolved in 100 ml of water, was added to the cyanuric chloride solution dropwise over approximately 10 minutes and the solution agitated for a further 15 minutes, then poured into an evaporating dish and left standing overnight. The following day the crystals of cyanuric azide dichloride were separated by filtration, washed with 100 ml of water, then placed in a silica gel filled desiccator to dry. Yield 32.4 grams; m.pt. 85°C.

1.6 grams of 2,7-dihydroxy naphthalene (1/100 mol) and 0.8 grams of sodium hydroxide were dissolved in 100 ml of water in a 250 ml beaker to form the sodium salt. Cyanuric azide dichloride, 1.91 grams (1/100 mol), was then dissolved in 50 ml acetone. The sodium salt solution was agitated and the cyanuric azide dichloride solution was added to the stirred solution. A white polymeric precipitate formed, and the suspension was heated to 60°C and kept at this temperature for 30 minutes with agitation. After cooling to room temperature, the precipitate was filtered and washed with water. It was then dried in an air-circulating oven at 70°C. Yield of white polymer 2.67 grams.

EXAMPLE 2

The procedure according to Example 1 was repeated except that 2.14 grams of 2,4-dihydroxy benzophenone were used instead of the 2,7-dihydroxy naphthalene.

EXAMPLE 3

The procedure according to Example 1 was repeated except that 2.14 grams of 2,2'-dihydroxy benzophenone were used.

EXAMPLE 4

The procedure according to Example 1 was repeated except that 1.52 grams of 2,4-dihydroxy acetophenone were used.

EXAMPLE 5

The procedure according to Example 1 was repeated except that 1.1 grams of 1,3-dihydroxybenzene were used.

EXAMPLE 6

The polymers obtained by the process described in Examples 1 to 5 were each dissolved in cyclohexanone and the solutions were used to dipcoat a series of copper clad laminates with the resist coatings and the coatings were dried in air by evaporation of the solvent at 65°C. Exposure of the resist coatings through a mask to U.V. light for 5 minutes, and development in toluene to remove the unexposed regions, yielded an image in each case of resist coating on the laminate which allowed the copper of the non-coated regions to be etched in a ferric chloride solution.

EXAMPLE 7

The polymer solutions obtained according to Example 6 were taken and 10% by weight of Michler's ketone were dissolved in them. The solutions were applied to a silicon oxide surface of silicon slices by a spincoating technique at 6000 r.p.m. The coated slices were stoved for 5 minutes at 70°C, then exposed in a vacuum chamber through a photomask to short-wave U.V. light (intensity 4.7 milliwatts per sq.cm.) for from 2½ to 30 seconds. The photoresist coatings were then developed by 1 minute's immersion in toluene. The silicon oxide films were then etched in hydrofluoric acid. A resolution of 0.5 micron windows was obtained.

What we claim is:

1. A light-sensitive polymeric compound of the formula I

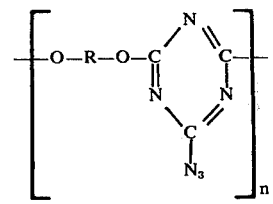

in which formula
n is a whole number from 2 to 120 and
R represents
phenylene - 1,3
phenylene - 1,4
1- phenylcarbonyl-phenylene - 2,4

1- phenylcarbonyl-phenylene - 2,6
2,2' - diphenylcarbonyl
2,3' - diphenylcarbonyl
or an
1 - alkylcarbonyl-phenylene - 2,5
1 - alkylcarbonyl-phenylene - 2,4
1 - alkylcarbonyl-phenylene - 2,6
in which the alkyl group contains from 1 to 4 carbon atoms,
a naphthylene - 2,7
naphthylene - 2,6 or
naphthylene - 2,4 - group
wherein the phenyl groups, if desired, are substituted with one or two alkyl groups containing from 1 to 4 carbon atoms or a phenyl group.

2. A light-sensitive compound according to claim 1 in which R represents a 2,2' - diphenyl carbonyl group.

3. A light-sensitive compound according to claim 1 in which R represents a naphthylene - 2,7 group.

4. A light-sensitive compound according to claim 1 in which R represents a 1-benzoyl phenylene - 2,4 group.

5. A light-sensitive compound according to claim 1 in which R represents a 1-acetyl phenylene - 2,4 group.

6. A light-sensitive compound according to claim 1 in which R represents a phenylene - 1,3.

* * * * *